(12) United States Patent
Schmidt et al.

(10) Patent No.: US 7,842,527 B2
(45) Date of Patent: Nov. 30, 2010

(54) METALORGANIC CHEMICAL VAPOR DEPOSITION (MOCVD) GROWTH OF HIGH PERFORMANCE NON-POLAR III-NITRIDE OPTICAL DEVICES

(75) Inventors: Mathew C. Schmidt, Santa Barbara, CA (US); Kwang-Choong Kim, Seoul (KR); Hitoshi Sato, Santa Barbara, CA (US); Steven P. DenBaars, Goleta, CA (US); James S. Speck, Goleta, CA (US); Shuji Nakamura, Santa Barbara, CA (US)

(73) Assignees: The Regents of the University of California, Oakland, CA (US); Japan Science and Technology Agency, Kawaguchi, Saitama Prefecture (JP)

( * ) Notice: Subject to any disclaimer, the term of this patent is extended or adjusted under 35 U.S.C. 154(b) by 0 days.

(21) Appl. No.: 12/001,286

(22) Filed: Dec. 11, 2007

(65) Prior Publication Data
US 2008/0164489 A1 Jul. 10, 2008

Related U.S. Application Data

(60) Provisional application No. 60/869,535, filed on Dec. 11, 2006.

(51) Int. Cl.
*H01L 21/00* (2006.01)
*H01L 33/00* (2006.01)
(52) U.S. Cl. .................... 438/29; 438/46; 257/102; 257/103; 257/E21.001; 257/E33.001
(58) Field of Classification Search ......... 257/102–103, 257/E21.001, E33.001; 438/29, 46
See application file for complete search history.

(56) References Cited

U.S. PATENT DOCUMENTS

| 5,793,054 | A | * | 8/1998 | Nido .......................... 257/18 |
| 5,994,205 | A | * | 11/1999 | Yamamoto et al. .......... 438/464 |
| 6,316,785 | B1 | | 11/2001 | Nunoue et al. |
| 6,586,819 | B2 | * | 7/2003 | Matsuoka .................. 257/628 |
| 6,648,966 | B2 | * | 11/2003 | Maruska et al. ............. 117/101 |
| 7,091,514 | B2 | | 8/2006 | Craven et al. |
| 7,709,284 | B2 | * | 5/2010 | Iza et al. ..................... 438/46 |
| 2002/0033521 | A1 | * | 3/2002 | Matsuoka .................. 257/627 |
| 2002/0144645 | A1 | | 10/2002 | Kim et al. |
| 2002/0175341 | A1 | * | 11/2002 | Biwa et al. ................. 257/103 |
| 2003/0024475 | A1 | | 2/2003 | Anderson |
| 2004/0106222 | A1 | * | 6/2004 | Steckl et al. ................ 438/22 |

(Continued)

OTHER PUBLICATIONS

Okamoto et al. (Dislocation-Free m-Plane InGaN/GaN Light-Emitting Diodes on m-plane GaN single Crystals), Japenese Journal of Applied Physics, vol. 45, No. 45, 2006, pp. L197-L1199.*
Chakraborty et al. (Demonstration of Nonpolar m-Plane InGaN/GaN Light-Emitting Diodes on Free-Standing m-Plane GaN Substrates), Japenese Journal of Applied Physics, vol. 44, No. 5, 2005, pp. L173-L175.*
International Search Report for PCT Application No. PCT/US2007/25249 filed Dec. 11, 2007.

(Continued)

*Primary Examiner*—Kenneth A Parker
*Assistant Examiner*—Jeremy J Joy
(74) *Attorney, Agent, or Firm*—Gates & Cooper LLP (57) ABSTRACT

A method of device growth and p-contact processing that produces improved performance for non-polar III-nitride light emitting diodes and laser diodes. Key components using a low defect density substrate or template, thick quantum wells, a low temperature p-type III-nitride growth technique, and a transparent conducting oxide for the electrodes.

28 Claims, 6 Drawing Sheets

U.S. PATENT DOCUMENTS

| | | | |
|---|---|---|---|
| 2005/0142391 | A1 | 6/2005 | Dmitriev et al. |
| 2005/0161688 | A1* | 7/2005 | Biwa et al. ............... 257/94 |
| 2005/0161697 | A1 | 7/2005 | Nakahata et al. |
| 2005/0214992 | A1* | 9/2005 | Chakraborty et al. ....... 438/172 |
| 2005/0258451 | A1 | 11/2005 | Saxler et al. |
| 2006/0118798 | A1* | 6/2006 | Lee ............................. 257/88 |
| 2006/0270087 | A1* | 11/2006 | Imer et al. .................... 438/46 |
| 2007/0114563 | A1* | 5/2007 | Paek et al. .................. 257/103 |
| 2007/0128844 | A1 | 6/2007 | Craven et al. |
| 2007/0218703 | A1* | 9/2007 | Kaeding et al. ............. 438/775 |

OTHER PUBLICATIONS

Shao, Y-P. et al., "Electrical Characterization of Semipolar Gallium Nitride Thin Films," NNIN REU Research Accomplishments, Aug. 2005, pp. 132-133.

Chakraborty, A. et al., "Demonstration of Non-Polar m-Plane InGaN/GaN Light-Emitting Diodes on Free-Standing m-Plane GaN Substrates," Jpn. J. Appl. Phys., 2005, pp. L173-L175, vol. 44, No. 5.

Masui, H. et al., "Polarized Light Emission From Non-Polar InGaN Light-Emitting Diodes Grown on a Bulk m-Plane GaN Substrate," Jpn. J. Appl. Phys., 2005, pp. L1329-L1332, vol. 44, No. 43.

Okamoto, K. et al., "Dislocation-Free m-Plane InGaN/GaN Light-Emitting Diodes on m-Plane GaN Single Crystals," Jpn. J. Appl. Phys., 2006, pp. L1197-L1199, vol. 45, No. 45.

Takeuchi, T. et al., "Quantum-Confined Stark Effect due to Piezoelectric Fields in GaInN Strained Quantum Wells," Jpn. J. Appl. Phys., 1997, pp. L382-L385, vol. 36, Part 2, No. 4A.

H. M. Ng, "Molecular-beam epitaxy of GaN/$Al_xGa_{1-x}N$ multiple quantum wells on R-plane (1012) sapphire substrates", Applied Physics Letters, vol. 80, No. 23, June 10, 2002, pp. 4369-4371.

* cited by examiner

METALORGANIC CHEMICAL VAPOR DEPOSITION (MOCVD) GROWTH OF HIGH PERFORMANCE NON-POLAR III-NITRIDE OPTICAL DEVICES

CROSS-REFERENCE TO RELATED APPLICATIONS

This application claims the benefit under 35 U.S.C. Section 119(e) of the following co-pending and commonly-assigned U.S. patent application:

U.S. Provisional Application Ser. No. 60/869,535, filed on Dec. 11, 2006, by Mathew C. Schmidt, Kwang Choong Kim, Hitoshi Sato, Steven P. DenBaars, James S. Speck, and Shuji Nakamura, entitled "MOCVD GROWTH OF HIGH PERFORMANCE M-PLANE GAN OPTICAL DEVICES,";

which application is incorporated by reference herein.

This application is related to the following co-pending and commonly-assigned applications:

U.S. Utility application Ser. No. 10/581,940, filed on Jun. 7, 2006, by Tetsuo Fujii, Yan Gao, Evelyn. L. Hu, and Shuji Nakamura, entitled "HIGHLY EFFICIENT GALLIUM NITRIDE BASED LIGHT EMITTING DIODES VIA SURFACE ROUGHENING," which application claims the benefit under 35 U.S.C. Section 365(c) of PCT Application Serial No. US2003/03921, filed on Dec. 9, 2003, by Tetsuo Fujii, Yan Gao, Evelyn L. Hu, and Shuji Nakamura, entitled "HIGHLY EFFICIENT GALLIUM NITRIDE BASED LIGHT EMITTING DIODES VIA SURFACE ROUGHENING,";

U.S. Utility application Ser. No. 11/054,271, filed on Feb. 9, 2005, by Rajat Sharma, P. Morgan Pattison, John F. Kaeding, and Shuji Nakamura, entitled "SEMICONDUCTOR LIGHT EMITTING DEVICE,";

U.S. Utility application Ser. No. 11/175,761, filed on Jul. 6, 2005, by Akihiko Murai, Lee McCarthy, Umesh K. Mishra and Steven P. DenBaars, entitled "METHOD FOR WAFER BONDING (Al,In,Ga)N and Zn(S,Se) FOR OPTOELECTRONICS APPLICATIONS," which application claims the benefit under 35 U.S.C. Section 119(e) of U.S. Provisional Application Ser. No. 60/585,673, filed Jul. 6, 2004, by Akihiko Murai, Lee McCarthy, Umesh K. Mishra and Steven P. DenBaars, entitled "METHOD FOR WAFER BONDING (Al,In,Ga)N and Zn(S,Se) FOR OPTOELECTRONICS APPLICATIONS,";

U.S. Utility application Ser. No. 11/697,457, filed Apr. 6, 2007, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY," which application is a continuation of U.S. Utility application Ser. No. 11/140,893, filed May 31, 2005, by, Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY," now U.S. Pat. No. 7,208,393, issued Apr. 24, 2007, which application claims the benefit under 35 U.S.C. Section 119(e) of U.S. Provisional Application Ser. No. 60/576,685, filed Jun. 3, 2004, by Benjamin A. Haskell, Melvin B. McLaurin, Steven P. DenBaars, James S. Speck, and Shuji Nakamura, entitled "GROWTH OF PLANAR REDUCED DISLOCATION DENSITY M-PLANE GALLIUM NITRIDE BY HYDRIDE VAPOR PHASE EPITAXY,";

U.S. Utility application Ser. No. 11/067,957, filed Feb. 28, 2005, by Claude C. A. Weisbuch, Aurelien J. F. David, James S. Speck and Steven P. DenBaars, entitled "HORIZONTAL EMITTING, VERITCAL EMITTING, BEAM SHAPED, DISTRIBUTED FEEDBACK (DFB) LASERS BY GROWTH OVER A PATTERNED SUBSTRATE,";

U.S. Utility application Ser. No. 11/923,414, filed Oct. 24, 2007, by Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE," which application is a continuation of U.S. Pat. No. 7,291,864, issued Nov. 6, 2007, to Claude C. A. Weisbuch, Aurelien J. F. David, James S. Speck and Steven P. DenBaars, entitled "SINGLE OR MULTI-COLOR HIGH EFFICIENCY LIGHT EMITTING DIODE (LED) BY GROWTH OVER A PATTERNED SUBSTRATE,";

U.S. Utility application Ser. No. 11/067,956, filed Feb. 28, 2005, by Aurelien J. F. David, Claude C. A Weisbuch and Steven P. DenBaars, entitled "HIGH EFFICIENCY LIGHT EMITTING DIODE (LED) WITH OPTIMIZED PHOTONIC CRYSTAL EXTRACTOR,";

U.S. Utility application Ser. No. 11/621,482, filed Jan. 9, 2007, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," which application is a continuation of U.S. Utility application Ser. No. 11/372,914, filed Mar. 10, 2006, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE," now U.S. Pat. No. 7,220,324, issued May 22, 2007, which application claims the benefit under 35 U.S.C. Section 119(e) of U.S. Provisional Application Ser. No. 60/660,283, filed Mar. 10, 2005, by Troy J. Baker, Benjamin A. Haskell, Paul T. Fini, Steven P. DenBaars, James S. Speck, and Shuji Nakamura, entitled "TECHNIQUE FOR THE GROWTH OF PLANAR SEMI-POLAR GALLIUM NITRIDE,";

U.S. Utility application Ser. No. 11/403,624, filed Apr. 13, 2006, by James S. Speck, Troy J. Baker and Benjamin A. Haskell, entitled "WAFER SEPARATION TECHNIQUE FOR THE FABRICATION OF FREE-STANDING (AL,IN,GA)N WAFERS," which application claims the benefit under 35 U.S.C. Section 119(e) of U.S. Provisional Application Ser. No. 60/670,810, filed Apr. 13, 2005, by James S. Speck, Troy J. Baker and Benjamin A. Haskell, entitled "WAFER SEPARATION TECHNIQUE FOR THE FABRICATION OF FREE-STANDING (AL,IN,GA)N WAFERS,";

U.S. Utility application Ser. No. 11/403,288, filed Apr. 13, 2006, by James S. Speck, Benjamin A. Haskell, P. Morgan Pattison and Troy J. Baker, entitled "ETCHING TECHNIQUE FOR THE FABRICATION OF THIN (AL,IN,GA)N LAYERS," which application claims the benefit under 35 U.S.C. Section 119(e) of U.S. Provisional Application Ser. No. 60/670,790, filed Apr. 13, 2005, by James S. Speck, Benjamin A. Haskell, P. Morgan Pattison and Troy J. Baker, entitled "ETCHING TECHNIQUE FOR THE FABRICATION OF THIN (AL,IN,GA)N LAYERS,";

U.S. Utility application Ser. No. 11/454,691, filed on Jun. 16, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS AND ITS FABRICATION METHOD," which application claims the benefit under 35 U.S.C. Section 119(e) of U.S. Provisional Application Ser. No. 60/691,710, filed on Jun. 17, 2005, by Akihiko Murai, Christina Ye Chen, Lee S. McCarthy, Steven P. DenBaars, Shuji Nakamura, and Umesh K. Mishra, entitled "(Al,Ga,In)N AND ZnO DIRECT WAFER BONDING STRUCTURE FOR OPTOELECTRONIC APPLICATIONS, AND ITS FABRICATION METHOD," U.S. Provisional Application Ser. No. 60/732,319, filed on Nov. 1, 2005, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS, AND ITS FABRICATION METHOD," and U.S. Provisional Application Ser. No. 60/764,881, filed on Feb. 3, 2006, by Akihiko Murai, Christina Ye Chen, Daniel B. Thompson, Lee S. McCarthy, Steven P. DenBaars, Shuji Nakamura, and Umesh K. Mishra, entitled "(Al,Ga,In)N AND ZnO DIRECT WAFER BONDED STRUCTURE FOR OPTOELECTRONIC APPLICATIONS AND ITS FABRICATION METHOD,";

U.S. Utility application Ser. No. 11/444,084, filed May 31, 2006, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH," which claims the benefit under 35 U.S.C. 119(e) of U.S. Provisional Application Ser. No. 60/685,952, filed on May 31, 2005, by Bilge M, Imer, James S. Speck, and Steven P. DenBaars, entitled "DEFECT REDUCTION OF NON-POLAR GALLIUM NITRIDE WITH SINGLE-STEP SIDEWALL LATERAL EPITAXIAL OVERGROWTH,";

U.S. Utility application Ser. No. 11/870,115, filed Oct. 10, 2007, by Bilge M, Imer, James S. Speck, Steven P. DenBaars and Shuji Nakamura, entitled "GROWTH OF PLANAR NON-POLAR M-PLANE III-NITRIDE USING METALORGANIC CHEMICAL VAPOR DEPOSITION (MOCVD)," which application is a continuation of U.S. Utility application Ser. No. 11/444,946, filed May 31, 2006, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD)," which claims the benefit under 35 U.S.C. 119(e) of U.S. Provisional Application Ser. No. 60/685,908, filed on May 31, 2005, by Bilge M, Imer, James S. Speck, and Steven P. DenBaars, entitled "GROWTH OF PLANAR NON-POLAR {1-100} M-PLANE GALLIUM NITRIDE WITH METALORGANIC CHEMICAL VAPOR DEPOSITION (MOCVD),";

U.S. Utility application Ser. No. 11/444,946, filed Jun. 1, 2006, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES," which claims the benefit under 35 U.S.C. 119(e) of U.S. Provisional Application Ser. No. 60/686,244, filed on Jun. 1, 2005, by Robert M. Farrell, Troy J. Baker, Arpan Chakraborty, Benjamin A. Haskell, P. Morgan Pattison, Rajat Sharma, Umesh K. Mishra, Steven P. DenBaars, James S. Speck, and Shuji Nakamura, entitled "TECHNIQUE FOR THE GROWTH AND FABRICATION OF SEMIPOLAR (Ga,Al,In,B)N THIN FILMS, HETEROSTRUCTURES, AND DEVICES,";

U.S. Utility application Ser. No. 11/251,365 filed Oct. 14, 2005, by Frederic S. Diana, Aurelien J. F. David, Pierre M. Petroff, and Claude C. A. Weisbuch, entitled "PHOTONIC STRUCTURES FOR EFFICIENT LIGHT EXTRACTION AND CONVERSION IN MULTI-COLOR LIGHT EMITTING DEVICES,";

U.S. Utility application Ser. No. 11/633,148, filed Dec. 4, 2006, Claude C. A. Weisbuch and Shuji Nakamura, entitled "IMPROVED HORIZONTAL EMITTING, VERTICAL EMITTING, BEAM SHAPED, DISTRIBUTED FEEDBACK (DFB) LASERS FABRICATED BY GROWTH OVER A PATTERNED SUBSTRATE WITH MULTIPLE OVERGROWTH," which application claims the benefit under 35 U.S.C. Section 119(e) of U.S. Provisional Application Ser. No. 60/741,935, filed Dec. 2, 2005, Claude C. A. Weisbuch and Shuji Nakamura, entitled "IMPROVED HORIZONTAL EMITTING, VERTICAL EMITTING, BEAM SHAPED, DFB LASERS FABRICATED BY GROWTH OVER PATTERNED SUBSTRATE WITH MULTIPLE OVERGROWTH,";

U.S. Utility application Ser. No. 11/517,797, filed Sep. 8, 2006, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION," which claims the benefit under 35 U.S.C. 119(e) of U.S. Provisional Application Ser. No. 60/715,491, filed on Sep. 9, 2005, by Michael Iza, Troy J. Baker, Benjamin A. Haskell, Steven P. DenBaars, and Shuji Nakamura, entitled "METHOD FOR ENHANCING GROWTH OF SEMIPOLAR (Al,In,Ga,B)N VIA METALORGANIC CHEMICAL VAPOR DEPOSITION,";

U.S. Utility application Ser. No. 11/593,268, filed on Nov. 6, 2006, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED)," which application claims the benefit under 35 U.S.C. Section 119(e) of U.S. Provisional Application Ser. No. 60/734,040, filed on Nov. 4, 2005, by Steven P. DenBaars, Shuji Nakamura, Hisashi Masui, Natalie N. Fellows, and Akihiko Murai, entitled "HIGH LIGHT EXTRACTION EFFICIENCY LIGHT EMITTING DIODE (LED),";

U.S. Utility application Ser. No. 11/608,439, filed on Dec. 8, 2006, by Steven P. DenBaars, Shuji Nakamura and James S. Speck, entitled "HIGH EFFICIENCY LIGHT EMITTING DIODE (LED)," which application claims the benefit under 35 U.S.C. Section 119(e) of U.S. Provisional Application Ser. No. 60/748,480, filed on Dec. 8, 2005, by Steven P. DenBaars, Shuji Nakamura and James S. Speck, entitled "HIGH EFFICIENCY LIGHT EMITTING DIODE (LED)," and U.S. Provisional Application Ser. No. 60/764,975, filed on Feb. 3, 2006, by Steven P. DenBaars, Shuji Nakamura and James S. Speck, entitled "HIGH EFFICIENCY LIGHT EMITTING DIODE (LED),";

U.S. Utility application Ser. No. 11/676,999, filed on Feb. 20, 2007, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES," which application claims the benefit under 35 U.S.C. Section 119(e) of U.S. Provisional Application Ser. No. 60/774,467, filed on Feb. 17, 2006, by Hong Zhong, John F. Kaeding, Rajat Sharma, James S. Speck, Steven P. DenBaars and Shuji Nakamura, entitled "METHOD FOR GROWTH OF SEMIPOLAR (Al,In,Ga,B)N OPTOELECTRONIC DEVICES,";

U.S. Utility patent application Ser. No. 11/840,057, filed on Aug. 16, 2007, by Michael Iza, Hitoshi Sato, Steven P. DenBaars, and Shuji Nakamura, entitled "METHOD FOR DEPOSITION OF MAGNESIUM DOPED (Al,In,Ga,B)N LAYERS," which claims the benefit under 35 U.S.C. 119(e) of U.S. Provisional Patent Application Ser. No. 60/822,600, filed on Aug. 16, 2006, by Michael Iza, Hitoshi Sato, Steven P. DenBaars, and Shuji Nakamura, entitled "METHOD FOR DEPOSITION OF MAGNESIUM DOPED (Al,In,Ga,B)N LAYERS,";

U.S. Utility patent application Ser. No. 11/940,848, filed on Nov. 15, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," which application claims the benefit under 35 U.S.C. Section 119(e) of U.S. Provisional Patent Application Ser. No. 60/866,014, filed on Nov. 15, 2006, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS," and U.S. Provisional Patent Application Ser. No. 60/883,977, filed on Jan. 8, 2007, by Aurelien J. F. David, Claude C. A. Weisbuch and Steven P. DenBaars entitled "HIGH LIGHT EXTRACTION EFFICIENCY LIGHT EMITTING DIODE (LED) THROUGH MULTIPLE EXTRACTORS,";

U.S. Utility patent application Ser. No. 11/940,853, filed on Nov. 15, 2007, by Claude C. A. Weisbuch, James S. Speck and Steven P. DenBaars entitled "HIGH EFFICIENCY WHITE, SINGLE OR MULTI-COLOUR LIGHT EMITTING DIODES (LEDS) BY INDEX MATCHING STRUCTURES," which application claims the benefit under 35 U.S.C. Section 119(e) of U.S. Provisional Patent Application Ser. No. 60/866,026, filed on Nov. 15, 2006, by Claude C. A. Weisbuch, James S. Speck and Steven P. DenBaars entitled "HIGH EFFICIENCY WHITE, SINGLE OR MULTI-COLOUR LED BY INDEX MATCHING STRUCTURES,";

U.S. Utility patent application Ser. No. 11/940,866, filed on Nov. 15, 2007, by Aurelien J. F. David, Claude C. A. Weisbuch, Steven P. DenBaars and Stacia Keller, entitled "HIGH LIGHT EXTRACTION EFFICIENCY LIGHT EMITTING DIODE (LED) WITH EMITTERS WITHIN STRUCTURED MATERIALS," which application claims the benefit under 35 U.S.C. Section 119(e) of U.S. Provisional Patent Application Ser. No. 60/866,015, filed on Nov. 15, 2006, by Aurelien J. F. David, Claude C. A. Weisbuch, Steven P. DenBaars and Stacia Keller, entitled "HIGH LIGHT EXTRACTION EFFICIENCY LED WITH EMITTERS WITHIN STRUCTURED MATERIALS,";

U.S. Utility patent application Ser. No. 11/940,876, filed on Nov. 15, 2007, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING," which application claims the benefit under 35 U.S.C. Section 119(e) of U.S. Provisional Patent Application Ser. No. 60/866,027, filed on Nov. 15, 2006, by Evelyn L. Hu, Shuji Nakamura, Yong Seok Choi, Rajat Sharma and Chiou-Fu Wang, entitled "ION BEAM TREATMENT FOR THE STRUCTURAL INTEGRITY OF AIR-GAP III-NITRIDE DEVICES PRODUCED BY PHOTOELECTROCHEMICAL (PEC) ETCHING,";

U.S. Utility patent application Ser. No. 11/940,885, filed on Nov. 15, 2007, by Natalie N. Fellows, Steven P. DenBaars and Shuji Nakamura, entitled "TEXTURED PHOSPHOR CONVERSION LAYER LIGHT EMITTING DIODE," which application claims the benefit under 35 U.S.C. Section 119(e) of U.S. Provisional Patent Application Ser. No. 60/866,024, filed on Nov. 15, 2006, by Natalie N. Fellows, Steven P. DenBaars and Shuji Nakamura, entitled "TEXTURED PHOSPHOR CONVERSION LAYER LIGHT EMITTING DIODE,";

U.S. Utility patent application Ser. No. 11/940,872, filed on Nov. 15, 2007, by Steven P. DenBaars, Shuji Nakamura and Hisashi Masui, entitled "HIGH LIGHT EXTRACTION EFFICIENCY SPHERE LED," which application claims the benefit under 35 U.S.C. Section 119(e) of U.S. Provisional Patent Application Ser. No. 60/866,025, filed on Nov. 15, 2006, by Steven P. DenBaars, Shuji Nakamura and Hisashi Masui, entitled "HIGH LIGHT EXTRACTION EFFICIENCY SPHERE LED,";

U.S. Utility patent application Ser. No. 11/940,883, filed on Nov. 15, 2007, by Shuji Nakamura and Steven P. DenBaars, entitled "STANDING TRANSPARENT MIRRORLESS LIGHT EMITTING DIODE," which application claims the benefit under 35 U.S.C. Section 119(e) of U.S. Provisional Patent Application Ser. No. 60/866,017, filed on Nov. 15, 2006, by Shuji Nakamura and Steven P. DenBaars, entitled "STANDING TRANSPARENT MIRROR-LESS (STML) LIGHT EMITTING DIODE,";

U.S. Utility patent application Ser. No. 11/940,898, filed on Nov. 15, 2007, by Steven P. DenBaars, Shuji Nakamura and James S. Speck, entitled "TRANSPARENT MIRRORLESS LIGHT EMITTING DIODE," which application claims the benefit under 35 U.S.C. Section 119(e) of U.S. Provisional Patent Application Ser. No. 60/866,023, filed on Nov. 15, 2006, by Steven P. DenBaars, Shuji Nakamura and James S. Speck, entitled "TRANSPARENT MIRROR-LESS (TML) LIGHT EMITTING DIODE,";

U.S. Utility patent application Ser. No. 11/954,163, filed on Dec. 11, 2007, by Steven P. DenBaars and Shuji Nakamura, entitled "LEAD FRAME FOR TRANSPARENT MIRRORLESS LIGHT EMITTING DIODE," which claims the benefit under 35 U.S.C. 119(e) of U.S. Provisional Patent Application Ser. No. 60/869,454, filed on Dec. 11, 2006, by Steven P. DenBaars and Shuji Nakamura, entitled "LEAD FRAME FOR TM-LED,";

U.S. Utility patent application Ser. No. 11/954,154, filed on Dec. 11, 2007, by Shuji Nakamura, Steven P. DenBaars, and Hirokuni Asamizu, entitled, "TRANSPARENT LIGHT EMITTING DIODES," which claims the benefit under 35 U.S.C. 119(e) of U.S. Provisional Patent Application Ser. No. 60/869,447, filed on Dec. 11, 2006, by Shuji Nakamura, Steven P. DenBaars, and Hirokuni Asamizu, entitled, "TRANSPARENT LEDS,";

U.S. Utility patent application Ser. No. 12/001,227, filed on Dec. 11, 2007, by Steven P. DenBaars, Mathew C. Schmidt, Kwang Choong Kim, James S. Speck, and Shuji Nakamura, entitled, "NON-POLAR AND SEMI-POLAR EMITTING DEVICES," which claims the benefit under 35 U.S.C. 119(e) of U.S. Provisional Patent Application Ser. No. 60/869,540, filed on Dec. 11, 2006, by Steven P. DenBaars, Mathew C. Schmidt, Kwang Choong Kim, James S. Speck, and Shuji Nakamura, entitled, "NON-POLAR (M-PLANE) AND SEMI-POLAR EMITTING DEVICES,"; and U.S. Utility patent application Ser. No. 11/954,172, filed on Dec. 11, 2007, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (AL,IN,GA,B)N ON VARIOUS SUBSTRATES," which claims the benefit under 35 U.S.C. 119(e) of U.S. Provisional Patent Application Ser. No. 60/869,701, filed on Dec. 12, 2006, by Kwang Choong Kim, Mathew C. Schmidt, Feng Wu, Asako Hirai, Melvin B. McLaurin, Steven P. DenBaars, Shuji Nakamura, and James S. Speck, entitled, "CRYSTAL GROWTH OF M-PLANE AND SEMIPOLAR PLANES OF (AL,IN,GA,B)N ON VARIOUS SUBSTRATES,";

all of which applications are incorporated by reference herein.

BACKGROUND OF THE INVENTION

1. Field of the Invention

This invention is related to the growth of semiconductor devices on non-polar III-nitride films, more specifically, LEDs (light emitting diodes), LDs (laser diodes), VCSELs (vertical cavity surface emitting lasers), RCLEDs (resonant cavity LEDs), and MCLEDs (micro-cavity LEDs).

2. Description of the Related Art (Note: This application references a number of different publications as indicated throughout the specification as indicated by the citation within brackets, i.e., [REF x], wherein x is a number. A list of these different publications identified by the number x can be found below in the section entitled "References." Each of these publications is incorporated by reference herein.)

Conventional III-nitride optical devices, such as gallium nitride (GaN) LEDs, are grown in the c-direction of the wurtzite unit cell. A net polarization occurs from contributions of spontaneous and piezoelectric polarizations in the direction of film growth. The resulting built-in electric field causes the band structure to be slanted, most notably in the quantum wells. This has a huge impact on the behavior of c-plane GaN optical devices. The slanted quantum wells consequently diminish the spatial overlap of the hole and electron wavefunctions, in turn decreasing radiative recombination efficiency. In addition, the emission wavelength decreases (blue shift) with increasing drive current as explained by the Quantum Confined Stark Effect (QCSE) [REF 1].

M-plane and a-plane GaN are defined as non-polar GaN because there is no net polarization field normal to those respective planes. Therefore, the band structure is not slanted like c-plane, which means quantum well structures on these planes have flat bands. Radiative efficiencies are theoretically higher, and no wavelength shift occurs. There have been recent reports of non-polar LEDs [REF 2, 3]. However, the output powers and efficiencies are well below that of c-plane LEDs. The main reason for this poor performance is commonly attributed to high dislocation densities.

Current non-polar GaN optical devices have not achieved the performance standards necessary for bringing them to market. The highest power m-plane LED reported is 1.79 mW at 20 mA [REF 3], and there has been no report of an electrically pumped LD grown on m-plane GaN. Optical devices grown on m-plane GaN have the benefit of emitting polarized light [REF 4]. This lends them well to the application of backlighting for displays, especially LCDs (liquid crystal displays), since a light polarizer would not be required.

Thus, there is a need in the art for improved methods of fabricating of high performance non-polar III-nitride optical devices. The present invention satisfies this need.

SUMMARY OF THE INVENTION

The present invention describes the materials and growth conditions necessary for achieving high performance non-polar III-nitride optoelectronic devices, and more specifically, non-polar GaN LEDs and LDs. The present invention includes several key concepts that, when utilized together, produce exceptional device performance.

The device is grown on a low defect density substrate. This substrate can be a bulk m-plane GaN substrate grown by hydride vapor phase epitaxy (HVPE) or an m-plane sidewall lateral epitaxial overgrowth (SLEO) template grown by MOCVD or HVPE. It is important to eliminate defects and stacking faults from the active region to decrease the number of non-radiative recombination centers and improve carrier transport properties.

The quantum wells in the multiple quantum well (MQW) structure of the active region are grown at temperatures ranging from approximately 845° C. to 890° C. to be approximately 8 to 12 nanometers (nm) thick, which is much larger than in typical c-plane LEDs (~2.5 nm). The quantum barriers in the MQW structure are grown at temperatures ranging from approximately 915° C. to 940° C. to be approximately 10 to 18 nanometers thick.

The p-type GaN is grown at a relatively low temperature, namely the quantum barrier growth temperature.

Transparent conducting oxide electrodes are deposited on the device used to enhance light extraction. Such oxides include, but are not limited to, indium-tin-oxide (ITO) and zinc oxide (ZnO), as well as other oxides and materials that are transparent at the wavelength(s) of interest.

BRIEF DESCRIPTION OF THE DRAWINGS

Referring now to the drawings in which like reference numbers represent corresponding parts throughout.

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Overview

The present invention describes how to grow state of the art m-plane GaN optical devices. The techniques depicted herein have been used to achieve improved m-plane GaN LED performance. These m-plane GaN LEDs have comparable output powers to the best quality c-plane GaN LEDs currently in existence. Such results represent a major breakthrough in optoelectronic devices.

Technical Description

The high performance m-plane GaN LEDs of the present invention are grown on ultra-low defect density substrates or templates. These substrates or templates can be, but are not limited to, bulk m-plane GaN substrates or m-plane SLEO templates. The SLEO template can be grown on a number of substrates including, but not limited to, m-SiC, $LiA_1O_x$, and spinel. Furthermore, growth on a properly miscut substrate can improve surface morphology stability. The current results are achieved on bulk GaN substrates, and the following description is specific to this case.

Figure 1:
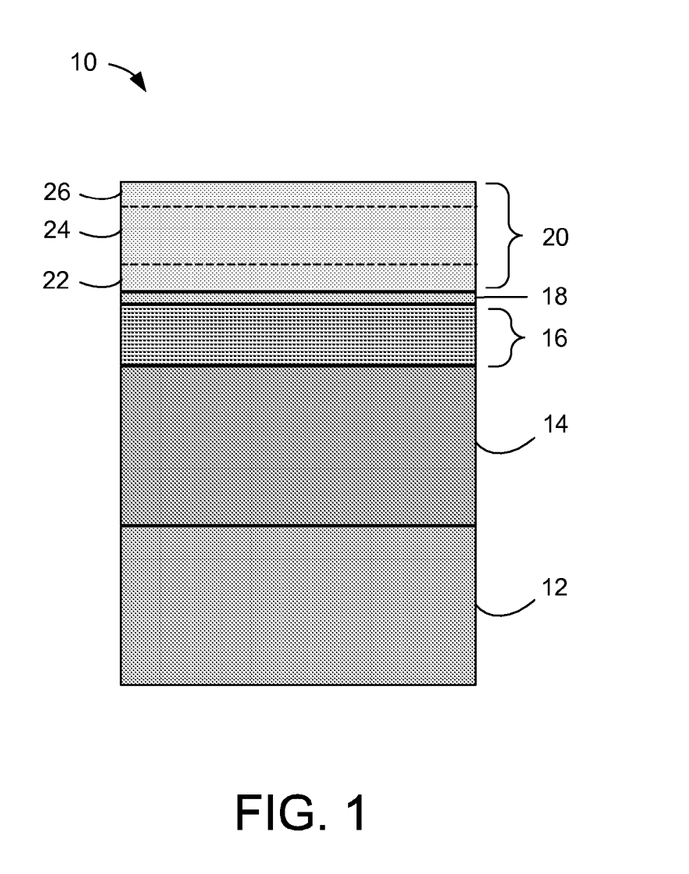
FIG. 1 is a schematic of the as-grown m-plane GaN LED utilizing the thick GaN buffer layer, thick quantum well layer, and three step p-GaN growth.

FIG. 1 is a schematic of the as-grown m-plane GaN LED 10 according to the preferred embodiment of the present invention. The m-plane GaN LED 10 includes a low defect substrate or template 12, an n-type GaN (n-GaN) layer 14 of approximately 10 microns thickness that is a buffer layer, an active region 16 including a multiple quantum well (MQW) structure with thick quantum wells that is used for high output power performance, an AlGaN electron blocking layer 18 of approximately 10 microns thickness, and a 3-stage or 3-part p-type GaN (p-GaN) layer 20 of approximately 160 nm thickness, wherein a bottom part 22 is grown at approximately 890° C. with high Mg doping and a thickness of approximately 40 nm, a center part 24 is grown at approximately 955° C. with light Mg doping and a thickness of approximately 90 nm, and a top part 26 is grown at approximately 955° C. with high Mg doping and a thickness of approximately 30 nm.

This LED device 10 is "regrown" in an MOCVD reactor on small pieces of bulk GaN with the m-axis normal to the growth direction. It is necessary to grow a very thick initial GaN layer 14, otherwise referred to as a thick GaN buffer layer, to achieve coalescence and a device quality surface with the particular bulk GaN substrates used. Approximately 8 to 15 microns of growth is usually necessary to achieve this objective. Film coalescence could also be achieved by using appropriate surface treatments. This initial GaN layer 14 is doped with Si to achieve an n-doped device layer 14. However, this layer 14 can also be unintentionally doped (UID) for an arbitrary thickness before switching to n-doped growth.

The active region 16 is grown after the n-doped GaN layer 14. The MQW structure in the active region 16 is comprised of a 6× stack of 80 Å wells and 180 Å barriers, although more or less wells and barriers can also be used. The quantum wells are made of InGaN, which can have a wide range of In fraction depending on what emission wavelength is desired. The quantum barriers are made of GaN, but can also be grown as InGaN layers with a lesser In fraction than the quantum wells.

The quantum wells are approximately 8 to 12 nm thick for best device performance, while the quantum barriers are approximately 10 to 18 nm thick. Other thicknesses for the quantum wells, as well as other thicknesses for the quantum barriers, can be used without departing from the scope of the present invention. For example, and not by way of limitation, the quantum barriers can be thinner, such as an approximately 10 nm quantum barrier thickness, which may optimize the performance of the device.

The active region 106 is grown at temperatures typically ranging from, but not limited to, 845° C. to 890° C. TEG, $NH_3$, and $N_2$ flows are kept at the same values for both the quantum well and barrier growths. TMI is only flowed during the quantum well growth, unless an active region 16 utilizing InGaN quantum barriers is used. In the latter case, the InGaN composition of the quantum barriers can be controlled by lowering the TMI flow while keeping the reactor temperature the same, or keeping the TMI flow constant while increasing the temperature. Typically, the former is used to avoid temperature ramp times. In addition, such an InGaN/InGaN MQW structure is often only utilized in laser diodes.

The emission wavelength of the device 10 is controlled by the In fraction of the quantum well layers. The In fraction is best controlled by varying the temperature of the reactor. Generally, growing at a lower temperature at a given TMI flow will result in a higher In fraction than growing at a higher temperature.

Usually, an m-plane LED is grown at a constant temperature for both the quantum well and barrier layers. However, a "two temperature" active region 16 can also be utilized. In such an active region 16, the quantum barriers are grown at a higher temperature than the quantum wells.

For example, the quantum wells are grown at temperatures ranging from approximately 845° C. to 890° C. to be approximately 8 to 12 nanometers thick. A thin GaN cap of 2 to 5 nm is grown right after a quantum well is grown. This cap is grown at the quantum well growth temperature, and is essentially the first part of the quantum barrier. Once this cap is grown, the reactor is ramped up to a temperature in the range of approximately 915° to 940° C., at which time the rest of the quantum barrier is grown, to be approximately 10 to 18 nanometers thick. The temperature is ramped backed down to the quantum well growth temperature and the process is repeated until the desired number of quantum wells and quantum barriers have been grown.

The AlGaN blocking layer 18 is grown after the last quantum barrier of the MQW structure 16. The Al composition of this layer 18 can be approximately between 12 to 20%. The AlGaN blocking layer 18 is grown at the quantum barrier growth temperature or at least at a temperature similar to the active region 16 growth temperature.

A low temperature Mg doped p-type GaN layer 20 is grown after the AlGaN blocking layer 18. Details of this layer 20 are described in U.S. Utility patent application Ser. No. 11/840,057 and U.S. Provisional Patent Application Ser. No. 60/822,600, which are cross-referenced above and incorporated by reference herein. Typically, such a layer 20 is grown at a relatively low temperature, namely the quantum barrier growth temperature, e.g., approximately less than 150° C. more than the quantum well growth temperature, and is of a 160 nm thickness, as noted above, but can be grown at other temperatures and other thicknesses as desired for the device design. Further, the layer 20 can be grown using other techniques without departing from the scope of the present invention.

Figure 2:
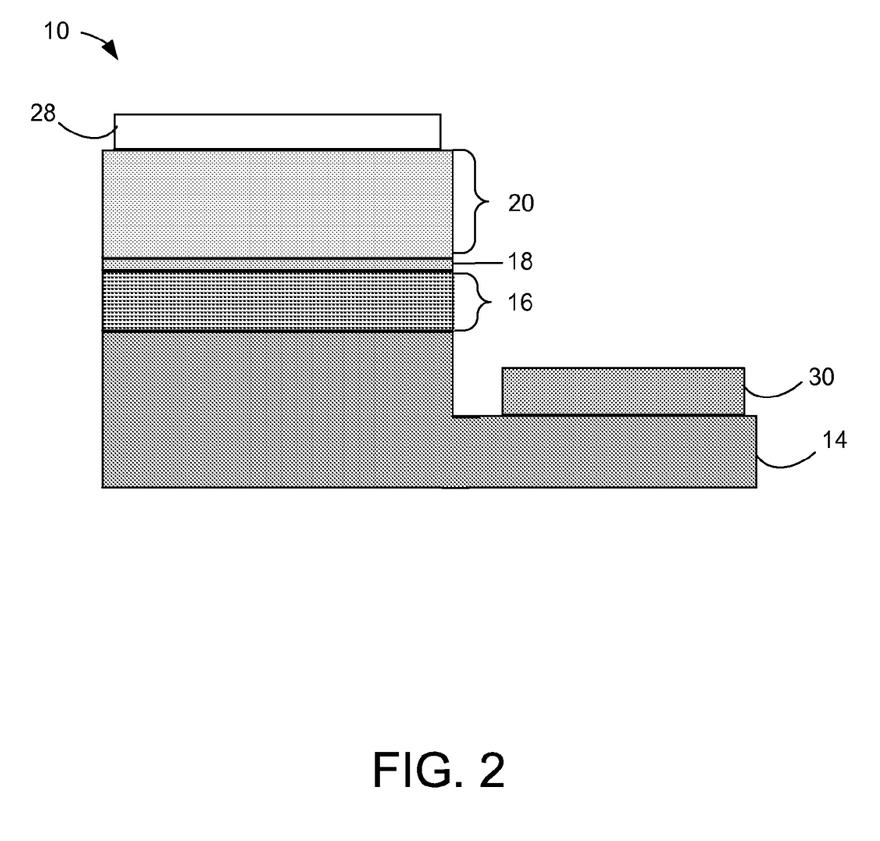
FIG. 2 is a schematic of the processed m-plane LED using an annealed ITO p-contact.

FIG. 2 is a schematic of the LED 10 that includes a p-contact 28 and n-contact 30. In this embodiment, both the p-contact 28 and n-contact 30 may comprise an ITO layer. The thickness of the ITO layer is 250 nm and is deposited via e-beam. The approximate thickness of the ITO layer range can be from 150 nm to 300 nm. ITO deposition can also be performed using other techniques, such as sputtering or chemical vapor deposition (CVD). The ITO layer is annealed at 600° C. in $N_2/O_2$ for approximately 5 minutes to make the ITO layer transparent. A subsequent anneal at 600° C. in $N_2$ for 10 minutes is performed to improve the sheet conductance of the ITO layer.

The resulting ITO layer are mostly transparent to the emitted light. Therefore, more light escapes from the top of the device 10 than in an LED processed with conventional methods. Of course, the method of packaging determines what light is going to be extracted. The presence of this ITO layer, along with ZnO discussed below, simply decreases the amount of absorption that occurs inside of the device 10.

Figure 3:
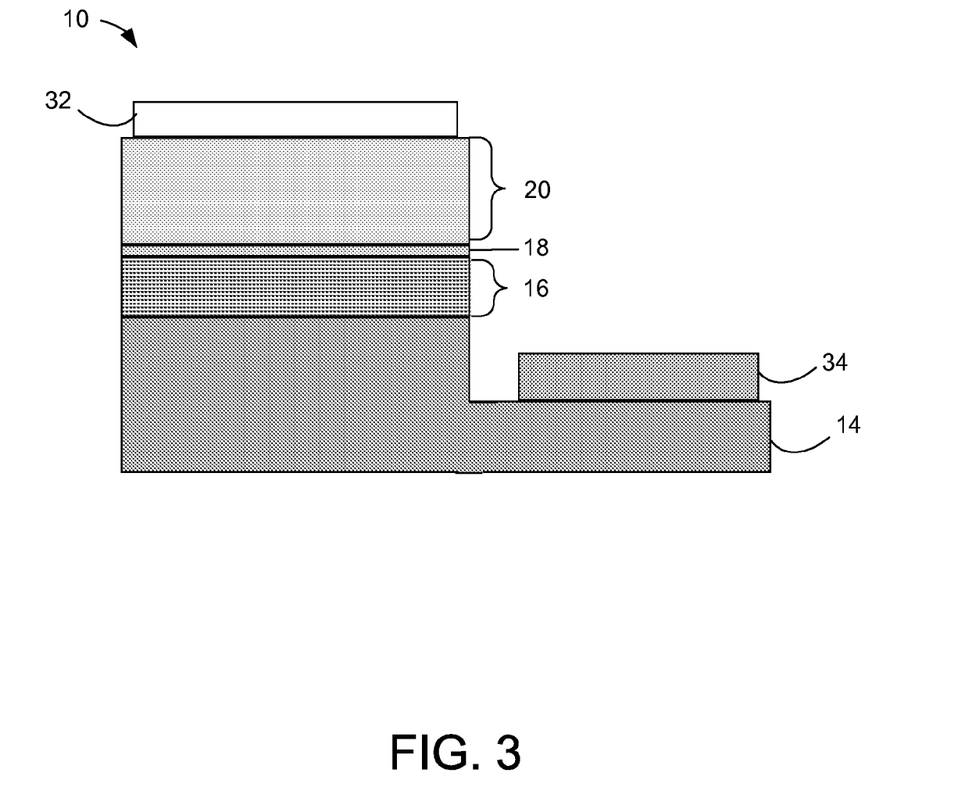
FIG. 3 is a schematic of the processed m-plane LED using ZnO as a p-contact.

FIG. 3 is also a schematic of the LED that includes the p-contact 32 and n-contact 34. In this embodiment, however, both the p-contact 32 and n-contact 34 may comprise a ZnO layer. The ZnO layer can be deposited via MOCVD, sputtering, e-beam, or any other CVD technique. Moreover, the ZnO layer can be undoped or doped with, but not limited to, Al or Ga.

As with the ITO layer, the ZnO layer is very transparent to the emitted light. Therefore, more light escapes from the top of the device 10 than in an LED processed with conventional methods.

Experimental Results

Figure 4:
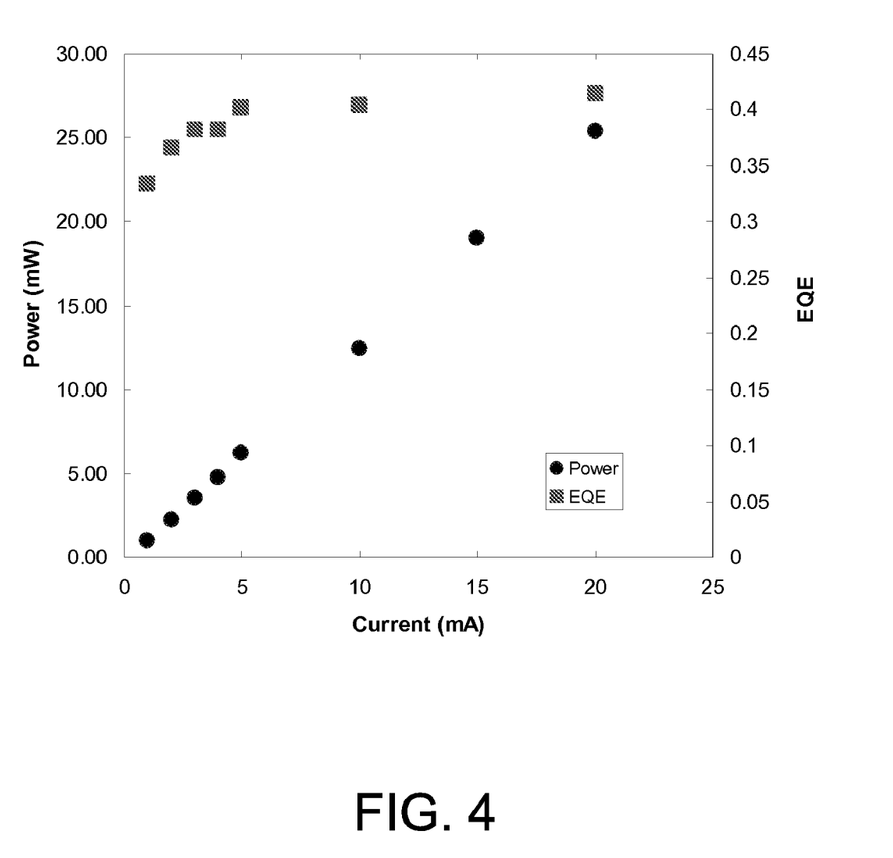
FIG. 4 is a graph of output power and external quantum efficiency (EQE) of the world record m-plane LED.

FIG. 4 is a graph of output power and external quantum efficiency (EQE) of the m-plane LED according to preferred embodiment of the present invention. As indicated, the power at 20 mA is 25.4 mW, the emission wavelength is at 403 nm, and the external quantum efficiency is 41.4% at 20 mA. The nature of the EQE curve is different than that observed in c-plane GaN LEDs. Note that the EQE continues to rise at 20 mA.

Figure 5:
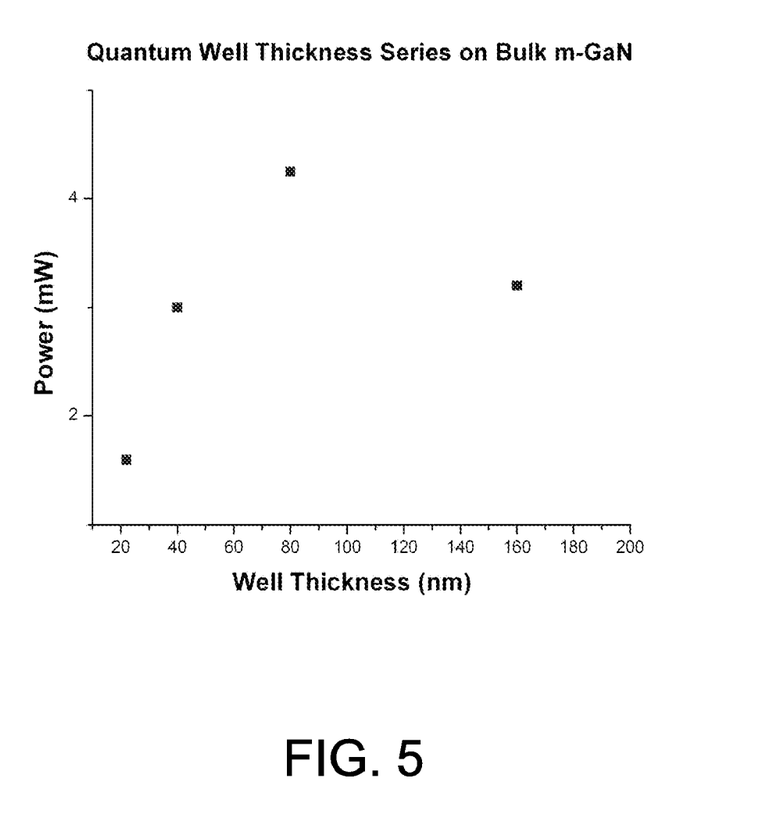
FIG. 5 is a graph of output power vs. quantum well thickness showing that thick wells (8-12 nm) are optimum for m-plane LEDs.

FIG. 5 is a graph of output power vs. quantum well thickness showing that thick wells (8-12 nm) are optimum for m-plane LEDs. This figure shows the output power dependence on quantum well thickness. A peak output power lies somewhere between 8 and 16 nm well widths. A typical c-plane LED, on the other hand, usually has a peak output power at about 2.5 nm well widths.

Process Steps

Figure 6:
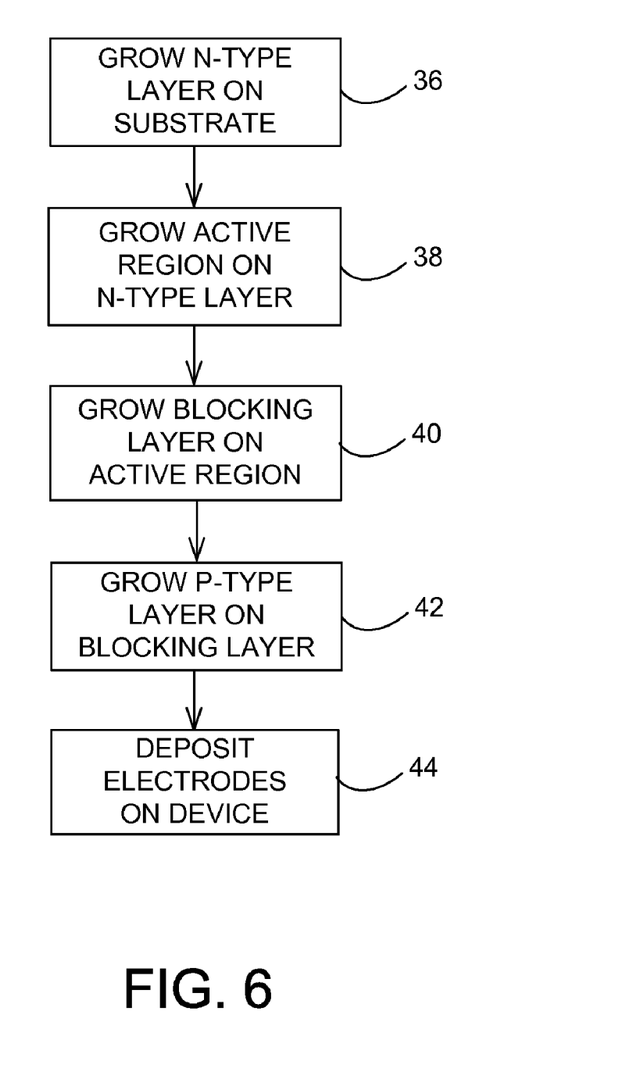
FIG. 6 is a flowchart illustrating the process steps performed according to the preferred embodiment of the present invention.

FIG. 6 is a flowchart illustrating the process steps performed according to the preferred embodiment of the present invention.

Block 36 represents an n-type GaN layer being grown on a non-polar III-nitride substrate or template.

Block 38 represents an active region including a quantum well structure being grown on the n-GaN layer.

Block 40 represents an AlGaN electron blocking layer being grown on the active region.

Block 42 represents a p-type GaN layer being grown on top of the AlGaN electron blocking layer.

Block 44 represents electrodes being deposited on the device.

Possible Modifications and Variations

Possible modifications and variations of the present invention include a polarized red-green-blue (RGB) light source can be realized by taking on a three (3) color active region. Such an active region has at least 3 distinct band edges that will emit in red, green and blue. The distinct band edges can be created by manipulating gas flows and temperature to control the (Al,In,Ga)N composition in the quantum wells.

In addition, the active region can be any composition of (Ga,Al,In,B)N. For example, an AlGaN/GaN or an AlGaN/AlGaN active region can be grown to produce a device that emits in the ultraviolet (UV) spectrum.

Finally, the previously described method can also be applied to a-plane and any semi-polar plane of GaN.

ADVANTAGES AND IMPROVEMENTS

The method described herein illustrates how to achieve high output optical devices on m-plane GaN. Very high output powers and high efficiencies have been obtained by using the MOCVD growth method and ITO electrodes previously described. The device growth on ultra low defect density substrates decreases the number of non-radiative recombination centers, which improves the output power efficiency of the device. Output power is further increased by using quantum wells that are thicker than typical c-plane GaN quantum wells. Furthermore, light extraction is enhanced by using a transparent oxide electrode (ITO). The end result is an m-plane GaN LED with world record performance.

The epitaxial innovations herein can also be applied to the growth of laser diodes on m-plane GaN substrates or templates. Transparent conducting oxides can be used in the fabrication of m-plane GaN laser diodes. In addition, the method described herein can also be applied to a-plane and any of the semi-polar planes of GaN. In these cases, the low defect substrate or template must be of the respective plane orientation.

REFERENCES

The following references are incorporated by reference herein:

1. Takeuchi et. al., Jpn. J. Appl. Phys. Vol. 36, Part 2, No. 4A, (1997), L382-L385.
2. Chakraborty et. al., Jpn. J. Appl. Phys. Vol. 44, No. 5, (2005), L173-L175.
3. Okamoto et. al., Jpn. J. Appl. Phys. Vol. 45, No. 45, (2006), L1197-L1199.
4. Masui et. al., Jpn. J. Appl. Phys. Vol. 44, No. 43, (2005), L1329-L1332.

CONCLUSION

The method described herein enables the realization of high power optical devices on m-plane GaN. LEDs on m-plane GaN fashioned with these techniques have comparable output powers at 20 mA as current c-plane LEDs. This method makes m-plane optical devices market relevant for the first time. M-plane LEDs of this high output power can be used as polarized light sources in liquid crystal displays (LCD) and other such applications where light polarization is required. It is conceivable that with further device optimization m-plane LEDs will eventually outperform c-plane LEDs in output power and efficiency. The same can be said for laser diodes on m-plane GaN.

Further, the method of the present invention can also be of benefit to other electronic, optoelectronic, or optical devices, such as solar cells, Vertical Cavity Surface Emitting Lasers (VCSELs), Resonant Cavity Light Emitting Diodes (RCLEDs), Micro Cavity Light Emitting Diodes (MCLEDs), High Electron Mobility Transistors (HEMTs), transistors, diodes, and other electronic devices that are resident on similar substrates or require similar semiconductor materials or processing steps.

Although described with respect to lateral devices herein, the present invention allows for the manufacture of bulk substrates, which will also allow for the manufacture of vertical devices on a number of substrate materials, e.g., the n-contact of the finished device can be on the bottom of a conducting substrate of a device manufactured in accordance with the present invention. The present invention is not limited to vertical devices, rather, the vertical devices are presented merely for illustration and not meant to limit the present invention.

Although the present invention describes m-plane GaN, other wurtzite crystalline structures, as well as other Group III nitride materials, can be used within the scope of the present invention. Further, other planes within the wurtzite structure, as well as semi-polar and non-polar structures of Group III nitrides and other materials, can also be used within the scope of the present invention. Although described with respect to LEDs, the m-plane growth techniques of the present invention are also applicable to other devices, such as laser diodes and other devices.

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching.

What is claimed is:

1. A method for fabricating a non-polar III-nitride Light Emitting Diode (LED), comprising:
    (a) growing an n-type III-nitride layer on a non-polar III-nitride substrate or template;
    (b) growing an active region including a quantum well structure on the n-type III-nitride layer, wherein a non-polar quantum well in the quantum well structure is grown at a quantum well growth temperature; and
    (c) growing a non-polar p-type III-nitride layer on the active region at a temperature less than 150° C. more than the quantum well growth temperature.

2. The method of claim 1, wherein the non-polar III-nitride substrate or template is a bulk non-polar III-nitride grown by an ammonothermal method.

3. The method of claim 1, wherein the non-polar III-nitride substrate or template is a non-polar sidewall lateral epitaxial overgrowth (SLEO) template grown by metalorganic chemical vapor deposition (MOCVD) or hydride vapor phase epitaxy (HVPE).

4. The method of claim 1, wherein the non-polar quantum well in the quantum well structure is grown to be approximately 8 to 12 nanometers thick.

5. The method of claim 1, wherein quantum well structure is grown at temperatures ranging from approximately 845° C. to 890° C.

6. The method of claim 1, wherein quantum barriers in the quantum well structure are grown to be approximately 10 to 18 nanometers thick.

7. The method of claim 1, wherein quantum barriers in the quantum well structure are grown at temperatures ranging from approximately 915° C. to 940° C.

8. The method of claim 1, wherein the p-type III-nitride layer is grown at a quantum barrier growth temperature.

9. The method of claim 1, further comprising depositing transparent oxide electrodes on the device.

10. The method of claim 9, wherein the electrodes are comprised of indium-tin-oxide (ITO) or zinc oxide (ZnO).

11. An optoelectronic device fabricated using the method of claim 1.

12. A non-polar III-nitride Light Emitting Diode (LED) device, comprising:
    (a) an n-type III-nitride layer grown on a non-polar III-nitride substrate or template;
    (b) an active region including a non-polar quantum well structure grown on the n-type III-nitride layer;
    (c) a non-polar p-type III-nitride layer grown on the active region; and
    (d) the LED having an external quantum efficiency (EQE) of at least 35%, and an output power of at least 25 mW at a drive current of 20 mA.

13. The device of claim 12, wherein the non-polar III-nitride substrate or template is a bulk non-polar III-nitride grown by an ammonothermal method.

14. The device of claim 12, wherein the non-polar III-nitride substrate or template is a non-polar sidewall lateral epitaxial overgrowth (SLEO) template grown by metalorganic chemical vapor deposition (MOCVD) or hydride vapor phase epitaxy (HVPE).

15. The device of claim 12, wherein a quantum well in the quantum well structure is grown to be approximately 8 to 12 nanometers thick.

16. The device of claim 12, wherein quantum well structure is grown at temperatures ranging from approximately 845° C. to 890° C.

17. The device of claim 12, wherein quantum barriers in the quantum well structure are grown to be approximately 10 to 18 nanometers thick.

18. The device of claim 12, wherein quantum barriers in the quantum well structure are grown at temperatures ranging from approximately 915° C. to 940° C.

19. The device of claim 12, wherein the p-type III-nitride layer is grown at a quantum barrier growth temperature.

20. The device of claim 12, further comprising transparent oxide electrodes deposited on the device.

21. The device of claim 20, wherein the electrodes are comprised of indium-tin-oxide (ITO) or zinc oxide (ZnO).

22. The method of claim 1, wherein the p-type III-nitride layer is a layer grown at a temperature at which quantum well barriers in the active region are grown.

23. The method of claim 1, wherein
    the LED has an external quantum efficiency (EQE) of at least 35%.

24. The method of claim 23, wherein the output power is at least 25 mW at a drive current of 20 mA.

25. The method of claim 1, wherein the non-polar III-nitride substrate or template is a bulk non-polar III-nitride grown by hydride vapor phase epitaxy (HVPE).

26. The device of claim 1, wherein the non-polar III-nitride substrate or template is a bulk non-polar III-nitride grown by hydride vapor phase epitaxy (HVPE).

27. The method of claim 1, wherein the n-type III-nitride layer is grown on an m-plane of the non-polar III-nitride substrate or template and the active region is grown on an m-plane of the n-type III-nitride layer.

28. The device of claim 12, wherein the n-type III-nitride layer is grown on an m-plane of the non-polar III-nitride substrate or template and the active region is grown on an m-plane of the n-type III-nitride layer.

* * * * *